(12) United States Patent
Roberge

(10) Patent No.: US 11,040,372 B2
(45) Date of Patent: Jun. 22, 2021

(54) LIGHT WEIGHT COMPONENT WITH INTERNAL REINFORCEMENT

(71) Applicant: United Technologies Corporation, Farmington, CT (US)

(72) Inventor: Gary D. Roberge, Tolland, CT (US)

(73) Assignee: RAYTHEON TECHNOLOGIES CORPORATION, Farmington, CT (US)

(*) Notice: Subject to any disclaimer, the term of this patent is extended or adjusted under 35 U.S.C. 154(b) by 0 days.

(21) Appl. No.: 16/377,730

(22) Filed: Apr. 8, 2019

(65) Prior Publication Data

US 2019/0299250 A1    Oct. 3, 2019

Related U.S. Application Data

(62) Division of application No. 15/096,631, filed on Apr. 12, 2016, now Pat. No. 10,399,117.

(51) Int. Cl.
*B32B 5/18*    (2006.01)
*B32B 5/20*    (2006.01)
(Continued)

(52) U.S. Cl.
CPC ............... *B05D 7/22* (2013.01); *B05D 7/14* (2013.01); *B05D 7/227* (2013.01); *B22F 3/26* (2013.01); *B22F 7/08* (2013.01); *B23H 9/001* (2013.01); *B23K 26/361* (2015.10); *B23K 26/362* (2013.01); *B23K 26/40* (2013.01); *B29C 45/14795* (2013.01); *B29C 70/68* (2013.01); *B32B 5/18* (2013.01); *B32B 5/20* (2013.01); *B32B 15/01* (2013.01); *B32B 15/011* (2013.01);
(Continued)

(58) Field of Classification Search
CPC .............. B32B 5/20; B32B 15/01; B32B 5/18
USPC ...................................................... 428/306.6
See application file for complete search history.

(56) References Cited

U.S. PATENT DOCUMENTS 3,261,733 A    7/1966    Bellinger
3,470,117 A    9/1969    Pearce
(Continued)

FOREIGN PATENT DOCUMENTS

DE          19526057 C1    4/1996
DE       202004018594 U1   2/2005
(Continued)

OTHER PUBLICATIONS

Bauer et al., Production and Application of Metal Foams in Casting Technology, 2013, Technical Gazette, URL: <https://pdfs.semanticscholar.org/fdec/b556209f08f2f6802e3d9f08eb346d3bf5e2.pdf?_ga=2.244678464.479671648.1567084494-2102526530.1566488025>, pp. 1095-1102 (Year: 2013).*
(Continued)

*Primary Examiner* — Humera N. Sheikh
*Assistant Examiner* — Katherine A Christy
(74) *Attorney, Agent, or Firm* — Cantor Colburn LLP

(57) ABSTRACT

A light weight component, the light weight component including: a metallic foam core formed into a desired configuration; an external metallic shell applied to an exterior surface of the metallic foam core after it has been formed into the desired configuration; an inlet opening and an outlet opening formed in the external metallic shell in order to provide a fluid path through the metallic foam core; and a thermoplastic material injected into the metallic foam core via the inlet opening.

16 Claims, 6 Drawing Sheets

(51) Int. Cl.

| | | |
|---|---|---|
| B32B 15/01 | (2006.01) | |
| B05D 7/22 | (2006.01) | |
| C23F 17/00 | (2006.01) | |
| B23H 9/00 | (2006.01) | |
| C25D 7/00 | (2006.01) | |
| C23C 4/129 | (2016.01) | |
| C23C 4/134 | (2016.01) | |
| C23C 24/02 | (2006.01) | |
| C23C 14/16 | (2006.01) | |
| C22F 1/18 | (2006.01) | |
| C22F 1/16 | (2006.01) | |
| C22F 1/10 | (2006.01) | |
| C22F 1/08 | (2006.01) | |
| C22F 1/06 | (2006.01) | |
| C22F 1/04 | (2006.01) | |
| B05D 7/14 | (2006.01) | |
| C22C 1/08 | (2006.01) | |
| F02C 7/12 | (2006.01) | |
| B23K 26/40 | (2014.01) | |
| C22C 14/00 | (2006.01) | |
| B22F 3/26 | (2006.01) | |
| B22F 7/08 | (2006.01) | |
| B29C 45/14 | (2006.01) | |
| B23K 26/361 | (2014.01) | |
| B29C 70/68 | (2006.01) | |
| B23K 26/362 | (2014.01) | |
| B33Y 10/00 | (2015.01) | |
| B23K 103/02 | (2006.01) | |
| B23K 103/08 | (2006.01) | |
| B29K 705/00 | (2006.01) | |
| B29K 105/12 | (2006.01) | |
| B22F 10/20 | (2021.01) | |

(52) U.S. Cl.
CPC .......... *B32B 15/012* (2013.01); *B32B 15/016* (2013.01); *C22C 1/08* (2013.01); *C22C 14/00* (2013.01); *C22F 1/04* (2013.01); *C22F 1/06* (2013.01); *C22F 1/08* (2013.01); *C22F 1/10* (2013.01); *C22F 1/16* (2013.01); *C22F 1/165* (2013.01); *C22F 1/183* (2013.01); *C23C 4/129* (2016.01); *C23C 4/134* (2016.01); *C23C 14/16* (2013.01); *C23C 24/02* (2013.01); *C23F 17/00* (2013.01); *C25D 7/00* (2013.01); *F02C 7/12* (2013.01); *B05D 2202/00* (2013.01); *B05D 2202/10* (2013.01); *B05D 2202/15* (2013.01); *B05D 2202/25* (2013.01); *B05D 2202/35* (2013.01); *B05D 2259/00* (2013.01); *B22F 10/20* (2021.01); *B22F 2998/10* (2013.01); *B23K 2103/02* (2018.08); *B23K 2103/08* (2018.08); *B29K 2105/12* (2013.01); *B29K 2705/00* (2013.01); *B32B 2305/022* (2013.01); *B33Y 10/00* (2014.12); *C22C 2001/083* (2013.01); *Y02P 10/25* (2015.11)

(56) References Cited

U.S. PATENT DOCUMENTS

| | | |
|---|---|---|
| 3,834,881 A | 9/1974 | Niebylski |
| 4,042,746 A | 8/1977 | Hofer |
| 5,112,663 A | 5/1992 | Morenz et al. |
| 5,550,338 A | 8/1996 | Hielscher |
| 5,594,216 A | 1/1997 | Yasukawa et al. |
| 6,196,307 B1 * | 3/2001 | Ozmat ............ F28F 13/003 165/185 |
| 6,254,151 B1 | 7/2001 | Lamparter |
| 6,436,480 B1 | 8/2002 | Upadhya |
| 7,905,275 B2 | 3/2011 | Behrens et al. |
| 8,887,864 B2 | 11/2014 | Sugimoto et al. |
| 9,468,118 B1 | 10/2016 | Peters |
| 2002/0104405 A1 | 8/2002 | Haack et al. |
| 2002/0121157 A1 | 9/2002 | Knott et al. |
| 2003/0181303 A1 | 9/2003 | Leinonen et al. |
| 2004/0226702 A1 | 11/2004 | Toonen et al. |
| 2005/0208361 A1 | 9/2005 | Enjoji et al. |
| 2006/0060421 A1 | 3/2006 | Sarin et al. |
| 2006/0285975 A1 | 12/2006 | Landis |
| 2007/0003806 A1 | 1/2007 | Sarkar et al. |
| 2007/0079507 A1 | 4/2007 | Cheng et al. |
| 2009/0035598 A1 | 2/2009 | Hanna et al. |
| 2009/0274924 A1 | 11/2009 | Pelzer et al. |
| 2009/0308571 A1 | 12/2009 | Thompson et al. |
| 2010/0313580 A1 | 12/2010 | Morioka et al. |
| 2010/0331173 A1 | 12/2010 | Ebener et al. |
| 2011/0065022 A1 | 3/2011 | Min et al. |
| 2011/0297269 A1 | 12/2011 | Pilon et al. |
| 2012/0152454 A1 | 6/2012 | Mass et al. |
| 2012/0167572 A1 | 7/2012 | Rice et al. |
| 2014/0007983 A1 | 1/2014 | Prest et al. |
| 2014/0021645 A1 * | 1/2014 | Rayess ............ B29C 45/14 264/69 |
| 2014/0103613 A1 | 4/2014 | Gomez |
| 2014/0169943 A1 | 6/2014 | Bunker et al. |
| 2015/0118441 A1 | 4/2015 | Shang et al. |
| 2015/0292818 A1 | 10/2015 | Wilding et al. |
| 2015/0323263 A1 | 11/2015 | Yanachi et al. |

FOREIGN PATENT DOCUMENTS

| | | |
|---|---|---|
| DE | 102005004695 B3 | 9/2006 |
| DE | 102011078674 A1 | 1/2013 |
| EP | 0486427 A1 | 5/1992 |
| EP | 1477578 A1 | 11/2004 |
| EP | 2019774 A1 | 2/2009 |
| EP | 2716868 A2 | 4/2014 |
| EP | 2811249 A1 | 12/2014 |
| EP | 2921649 A1 | 9/2015 |
| EP | 2977556 A1 | 1/2016 |
| JP | 2004360630 A | 12/2004 |
| RU | 2592871 C1 | 7/2006 |
| WO | 9833621 A1 | 8/1998 |
| WO | 9848948 | 11/1998 |
| WO | 2005057701 A1 | 6/2005 |
| WO | 2007073592 A1 | 7/2007 |
| WO | 2007134626 A1 | 11/2007 |
| WO | 2011010874 A2 | 1/2011 |
| WO | 2011144417 A1 | 11/2011 |

OTHER PUBLICATIONS

Davies G. J. et al.: "Metallic Foam: Their Production, Properties and Applications", Journal of Materials Science, Kluwer Academic Publishers, vol. 18, No. 7.

EP Office Action dated Jul. 30, 2018 for Application No. 17 166 220.8.

EP Office Action dated Sep. 6, 2018 for Application No. 17 166 353.7.

EP Office Action for Application No. 17 166 220.8; dated Mar. 6, 2019.

EP Office Action for Application No. 17 166 349.5; dated Apr. 1, 2019.

EP Office Action for Application No. 17 166 353.7; dated Apr. 18, 2019.

EP Office Action for Application No. 17 166 366.9; dated May 16, 2019.

EP Office Action for Application No. 17 166 368.5; dated May 16, 2019.

European Search Report Application No. EP 17 16 6368.
European Search Report for Application No. EP 17 16 6349.
European Search Report for Application No. EP 17 16 6353.
European Search Report for Application No. EP 17 16 6366.
European Search Report for Application No. EP 17 16 6371.
European Search Report for Application No. EP 17 16 6376.

(56) References Cited

OTHER PUBLICATIONS

European Search Report for EP Application No. 17 16 6220.
No Author et al: "Stabilitat vereint Leichtigkeit AFS—Einstoff-Aluminium-Sandwich Metal Foam: Weltweit Einzigartig Stabilitat vereint Leichtigkeit AFS-Einstoff-Aluminium-Sandwich", Mar. 4, 2016.
Partial EP Search Report for EP Application No. EP 17 16 6353.
RU 2,592, 871 Machine Translation, 5 pages.
EP Office Action for Application No. 17 166 371.9; dated May 16, 2019 (8 pages).
EP Office Action for Application No. 17 166 220.8; dated Sep. 23, 2019 (5 pages).
EP Office Action for Application No. 17 166 220.8: dated Mar. 9, 2020.

\* cited by examiner

LIGHT WEIGHT COMPONENT WITH INTERNAL REINFORCEMENT

CROSS REFERENCE TO RELATED APPLICATIONS

This application is a divisional application of U.S. patent application Ser. No. 15/096,631 filed on Apr. 12, 2016, the entire contents of which is incorporated herein by reference thereto.

BACKGROUND

This disclosure relates generally to methods of making low-cost, light weight components and components formed by the aforementioned methods. In particular, the present application is directed to a component formed from a composite of metallic foam and an external metallic shell. In addition, various embodiments of the present disclosure are also directed to methods for making such a component.

Commercially suitable components need to meet specific performance criteria. However, while a component may meet certain performance criteria it may be at the cost of other desirable factors such as component weight, time to manufacture and cost to manufacture. For example, subtractive manufacturing or machining oversized blocks, materials or forgings until a desired final part shape is achieved may be one process. However, and in this process, the monolithic nature of the raw input material means that the final part weight is driven by the final volume of the part and density of material used.

Accordingly, it is desirable to provide low-cost, light weight components and components formed by such methods.

BRIEF DESCRIPTION

A method of making a light weight component is provided. The method including the steps of: forming a metallic foam core into a desired configuration; applying an external metallic shell to an exterior surface of the metallic foam core after it has been formed into the desired configuration; forming an inlet opening and an outlet opening in the external metallic shell in order to provide a fluid path through the metallic foam core; and injecting a thermoplastic material into the metallic foam core via the inlet opening.

In addition to one or more of the features described above, or as an alternative to any of the foregoing embodiments, wherein the metal of the metallic foam core is selected from the group comprising: titanium; cobalt; aluminum; nickel; steel alloys, magnesium, copper, molybdenum, niobium, tungsten, zinc alloys, titanium aluminide, nickel aluminide and molybdenum disilicide.

In addition to one or more of the features described above, or as an alternative to any of the foregoing embodiments, wherein the metallic foam core is an open cell structure.

In addition to one or more of the features described above, or as an alternative to any of the foregoing embodiments, wherein the metallic foam core is formed into the desired configuration by a machining process selected from the group comprising: milling; electrical discharge machining (EDM); water-jet machining; and laser machining, wherein the desired configuration is slightly smaller than the final dimensions of the light weight component.

In addition to one or more of the features described above, or as an alternative to any of the foregoing embodiments, wherein the metallic foam core is a sheet of metallic foam and the sheet of metallic foam is formed into the desired configuration by a hot or cold forming process wherein the sheet of metallic foam is placed in a die.

In addition to one or more of the features described above, or as an alternative to any of the foregoing embodiments, wherein the metallic foam core is formed into the desired configuration by a machining process selected from the group comprising: milling; grinding; electrical discharge machining (EDM); water-jet machining; and laser machining after the hot or cold forming process.

In addition to one or more of the features described above, or as an alternative to any of the foregoing embodiments, wherein the external metallic shell is deposited on the exterior surface of the metallic foam core via an application process selected from the group comprising: flame spray application process; plasma spray application process; cold-spray application process; electron beam physical vapor deposition (EB/PVD), chemical vapor deposition (CVD); and electroplating application process.

In addition to one or more of the features described above, or as an alternative to any of the foregoing embodiments, wherein an interim coat is deposited on the exterior surface of the metallic foam core prior to the application of the external metallic shell.

In addition to one or more of the features described above, or as an alternative to any of the foregoing embodiments, wherein the interim coat is a ceramic based thermal barrier coating.

In addition to one or more of the features described above, or as an alternative to any of the foregoing embodiments, further including the step of: heat treating the metallic foam core after the external metallic shell has been applied to the exterior surface of the metallic foam core.

In addition to one or more of the features described above, or as an alternative to any of the foregoing embodiments, further including the step of: forming additional features in the metallic foam core after the external metallic shell has been applied to the exterior surface of the metallic foam core.

In addition to one or more of the features described above, or as an alternative to any of the foregoing embodiments, wherein the additional features are formed by a drilling process.

In addition to one or more of the features described above, or as an alternative to any of the foregoing embodiments, wherein the inlet opening and the outlet opening are formed by a drilling process.

In addition to one or more of the features described above, or as an alternative to any of the foregoing embodiments, wherein a thickness of the external metallic outer shell varies in order to provide localized structural rigidity to the component.

In addition to one or more of the features described above, or as an alternative to any of the foregoing embodiments, wherein the component is a bracket.

In addition to one or more of the features described above, or as an alternative to any of the foregoing embodiments, a component formed by anyone of the above methods.

In yet another embodiment, a method of making a light weight component is provided. The method including the steps of: forming a metallic foam core into a desired configuration; applying an external metallic shell to an exterior surface of the metallic foam core after it has been formed into the desired configuration, wherein the external metallic shell is selectively applied to vary the thickness of the external metallic shell in order to provide localized structural rigidity to the component; forming an inlet opening and an outlet opening in the external metallic shell in order to provide a fluid path through the metallic foam core; and injecting a thermoplastic or other fluid flowing and subsequently solidifying material into the metallic foam core via the inlet opening.

In addition to one or more of the features described above, or as an alternative to any of the foregoing embodiments, wherein the metallic foam core is formed into the desired configuration by a machining process selected from the group comprising: milling; grinding; electrical discharge machining (EDM); water-jet machining; and laser machining.

In yet another embodiment, a component is provided. The component having: a metallic foam core having a desired configuration; an external metallic shell applied to an exterior surface of the metallic foam core after it has been placed into the desired configuration; and a thermoplastic material located in the metallic foam core, wherein the thermoplastic material is located in the metallic foam core after the external metallic shell has been applied to the exterior surface of the metallic foam core.

In addition to one or more of the features described above, or as an alternative to any of the foregoing embodiments, wherein a thickness of the external metallic shell varies in order to provide localized structural rigidity to the component and wherein the metal of the metallic foam core is selected from the group comprising: titanium; cobalt; aluminum; nickel; steel alloys; magnesium; copper; molybdenum; niobium; tungsten; zinc alloys; titanium aluminide; nickel aluminide; and molybdenum disilicide.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Various embodiments of the present disclosure are related to methods of making low cost, light weight components and components formed by the aforementioned methods. In particular, the present application is directed to a component having an internal foam core, which in one embodiment may be a metallic foam core or alternatively a non-metallic foam core such as a ceramic foam core or any other non-metallic foam core and an external metallic shell surrounding the metallic foam core or non-metallic and methods for making such a component.

The present disclosure is directed to a method of making a component using a combination of subtractive and additive manufacturing processes. In general, the method starts with a metallic foam core using alloy and foam density that is compatible with a specific design application. As mentioned above and in alternative embodiments, the foam core may be non-metallic. The metallic foam core is then machined or formed to a shaped pre-form for subsequent manufacturing steps. After the metallic foam core is formed to the desired shape, a metallic skin is applied to the external surface of the metallic foam core creating a light-weight, rigid structure which can have characteristics similar to existing non-metallic foam core or metallic or non-metallic honeycomb components. After the metallic skin is applied a final machining of the component may occur wherein dimensional characteristics and/or features are added to the component.

Figure 1:
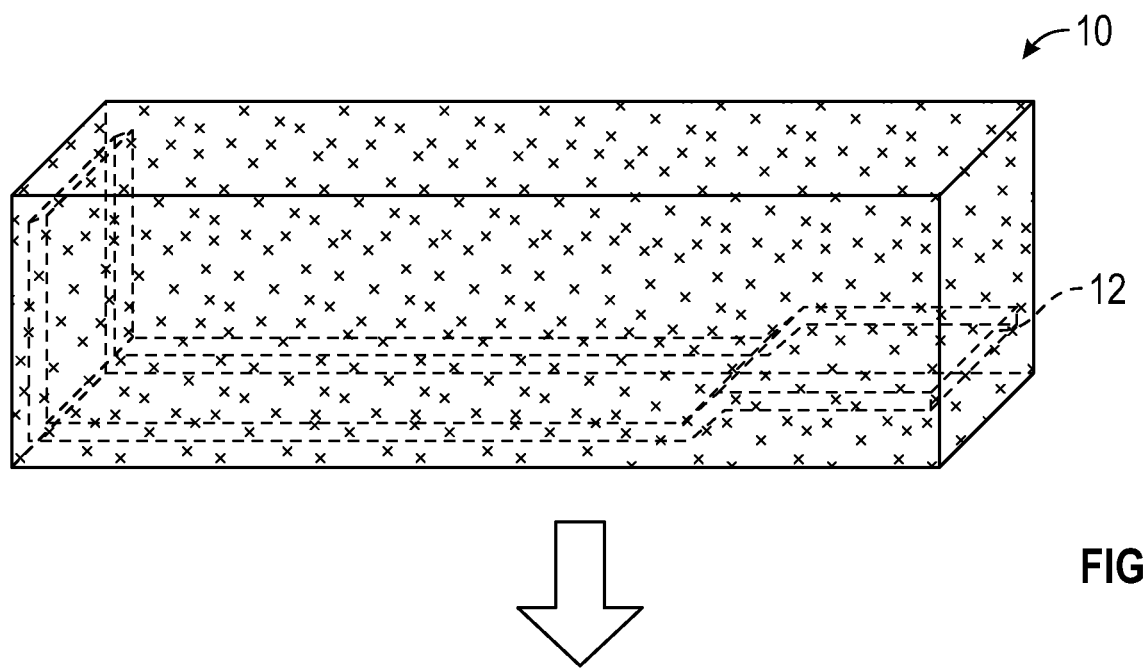
FIG. 1 is a perspective view of an un-machined block of metallic foam.

Referring now to FIG. 1, an unformed block of metallic foam 10 is illustrated. The block of metallic foam 10 may be formed from any suitable metal either commercially pure or alloy including but not limited to anyone of the following: titanium (including Ti 6-4, Ti 6-2-4-2, beta phase alloys including Beta 21s), cobalt, aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. In general, a metallic foam may be referred to as a cellular structure comprising a solid metal with a large volume fraction of pores. These pores may be sealed (closed-cell foam) or interconnected (open-cell foam). In one non-limiting embodiment, the porosity of the foam may be within the range of 5% to 80%. Of course, ranges of porosity greater or less than the aforementioned range are considered to be with the scope of various embodiments of the present disclosure. Selection of the porosity of the metallic foam may be dependent upon the ultimate end use of the component to be formed. For example and in some applications, it may be desirable to have a more porous foam core or a less porous foam core. The metallic foam block 10 is large enough to contain a desired part or component geometry 12 illustrated by the dashed lines 12 in FIG. 1.

Figure 2:
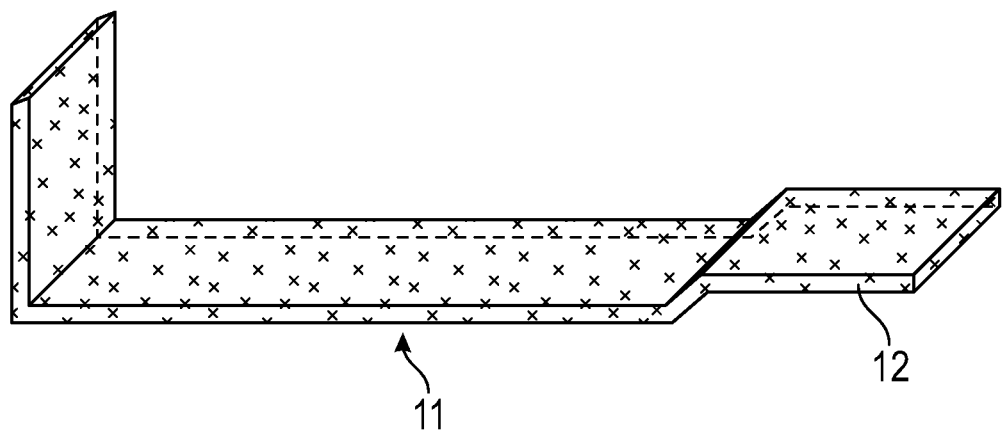
FIG. 2 is a perspective view of a machined block of metallic foam.

In FIG. 2, the block of metallic foam 10 has been machined into a foam core 11 having the desired interim part or interim component geometry 12 via any suitable process. As used herein interim part or interim component geometry may be referred to as being slightly smaller than the final part or component geometry in order to account for the applied external metallic shell 20. In some applications, it may be desirable to form the metallic foam core to near net shape as part of the initial foam manufacturing process.

Examples of machining processes include but are not limited to milling, grinding, electrical discharge machining (EDM), water-jet machining, laser machining, combinations thereof or any other process capable of machining the block 10 into the metallic foam core 11 having the component geometry 12.

Figure 3:
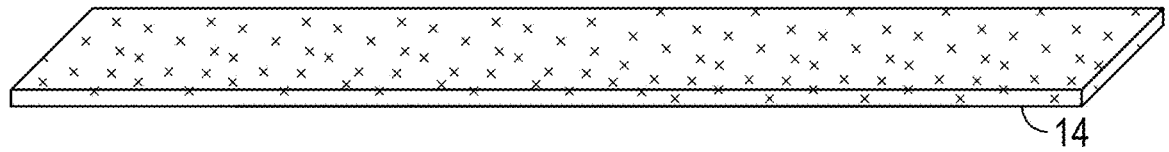
FIG. 3 is a perspective view of an un-formed sheet of metallic foam.
Figure 3A:
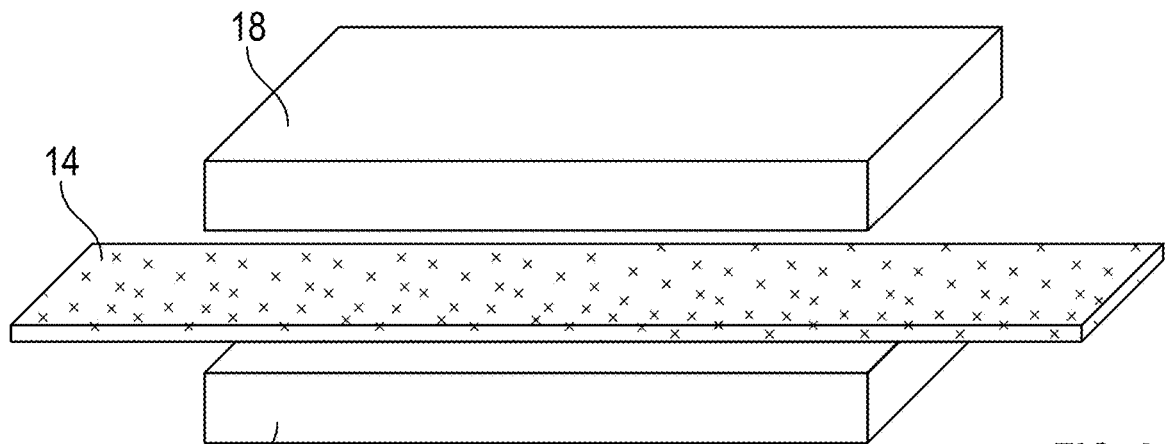
FIG. 3A is a perspective view of the un-formed sheet of metallic foam placed in a die for forming the un-formed sheet of metallic foam.
Figure 4:
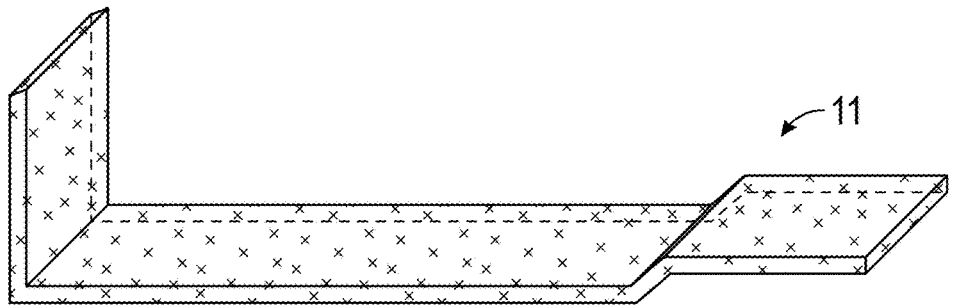
FIG. 4 is a perspective view of a formed sheet of metallic foam.

Alternatively and as illustrated in FIGS. 3, 3A and 4, a sheet of metallic foam 14 may be provided. In this alternative process, the sheet of metallic foam 14 is formed into the foam core 11 having the desired part or component geometry 12 via a hot or cold forming process wherein the sheet of metallic foam 14 is placed in a die 16. The die 16 may include a pair of complementary halves 18 configured to form the desired part or component geometry 12. In alternative embodiments, the die 16 may have more than one pair of elements or die halves 18.

The formed component or metallic core 11 is illustrated in FIG. 4. The formed sheet of metallic foam may be further shaped to a final configuration using the aforementioned machining processes such as milling, electrical discharge machining (EDM), water jet machining, laser machining, combinations thereof or any other process capable of machining the formed sheet of metallic foam.

Figure 5:
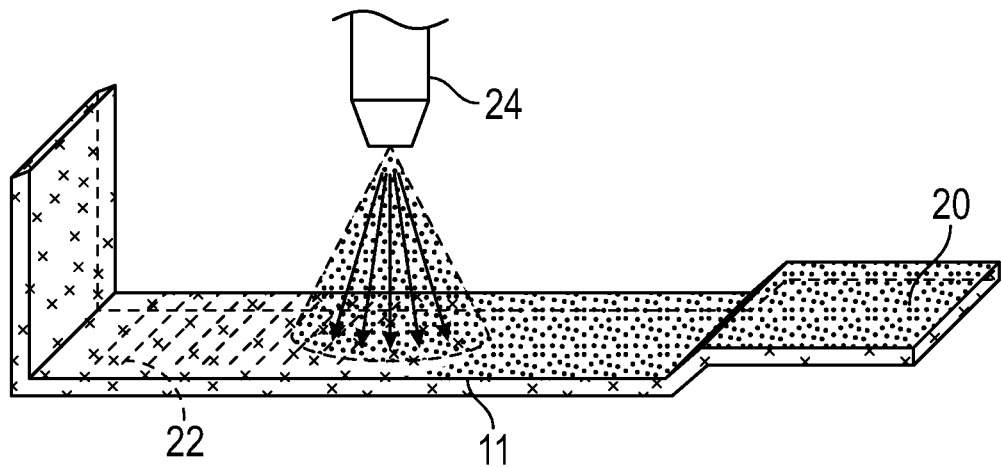
FIG. 5 illustrates the application of an external metallic shell to the formed or machined metallic foam of FIG. 2 or 4.

Referring now to at least FIG. 5, the formed metallic foam core 11 from any of the aforementioned processes (machining, forming or combinations thereof) depicted in at least FIGS. 1-4, has an external metallic shell 20 deposited on the exterior surface of the formed metallic foam core 11. In one embodiment, the external metallic shell 20 is deposited about the entire exterior surface of the formed metallic foam core 11. Alternatively, discrete areas of the formed metallic foam core may be masked such that the external metallic shell 20 is prohibited from covering certain areas. The external metallic shell 20 may also be referred to as an outer reinforcing metallic skin 20. Accordingly, the metallic foam pre-form or core 11 is used as a base for application of the external metallic shell 20. Depending on the initial foam cell size and material being deposited as well as the deposition method, it may be permissible to have an interim coat or applique to form a non-porous intermediate layer for metallic deposition. In this embodiment, the interim coat is first applied and then the external metallic shell 20 is applied to the metallic foam pre-form or core 11. In FIG. 5, the interim coat is illustrated by the dashed lines 22. The external metallic shell 20 is a metallic material chemically and metalurgically compatible with that of the metallic foam and the external metallic outer shell 20 may be applied via any suitable methods including but not limited to the following application processes: flame spray application; plasma spray application; cold-spray application; electron beam physical vapor deposition (EB/PVD), chemical vapor deposition (CVD), electroplating, additive manufacturing (including but not limited to electron beam melt, direct metal later sintering, free-form laser deposition, etc.) or any other suitable means. The external metallic outer skin can be made of any of the same alloys listed in the core section which includes but is not limited to titanium (including Ti 6-4, Ti 6-2-4-2, beta phase alloys including Beta 21s), cobalt aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. The material used in the external metallic outer skin may be the same or may be different than that used in the foam core depending on the metallurgical compatibility of the outer skin to the foam core. In addition and in some instances when a different alloys is used for the external skin 20 as opposed to that used for the foam core, one or more intermediate alloys may be used as interim coat or coats 22 covering portions or all of the part to bridge the compatibility of the core alloy 11 and the outermost skin alloy 20.

Other non-metallic materials may be deposited in place of or in addition to the metallic coatings, these coatings may include ceramic based thermal barrier coatings.

Figure 6:
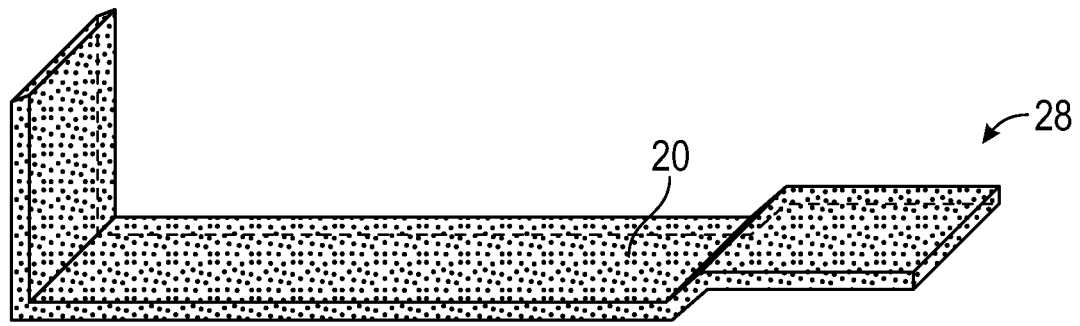
FIG. 6 illustrates the formed or machined metallic foam of FIG. 2 or 4 with an applied external metallic shell.

In FIG. 5, a nozzle 24 is illustrated and in one embodiment, the nozzle 24 may be used in conjunction with a plasma spray application process. Once the external metallic outer shell 20 is applied to the exterior surface of the metallic foam pre-form or core 11, this part, as illustrated in FIG. 6, is inspected for surface coverage and may be further subjected to a heat treating step in order to relieve residuals stresses imparted by manufacturing and outer skin deposition processes and/or to provide desired final material properties. In applications where the foam core is an open cell structure, the outer skin may be perforated with a plurality of venting holes to allow for internal air to escape from the part as it is heated during the heat treating step. In one embodiment, the venting holes may be sealed after the heat treating step and in other embodiments, the venting holes may be subsequently sealed after the heat treating step.

Figure 7:
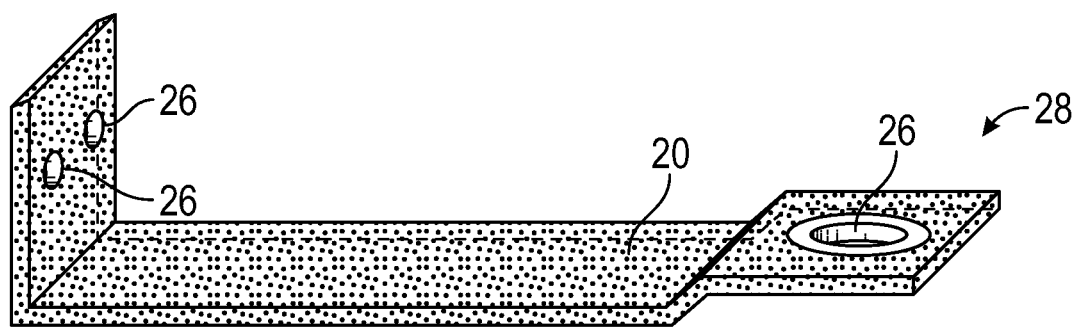
FIG. 7 illustrates the formed or machined metallic foam of FIG. 6 with additional features formed therein.

At the next step, additional features 26 are introduced to the coated metallic foam pre-form or core 11 in order to form the desired part or component 28. These additional features may be added by any suitable process such as milling, spot-face drilling, counter-bore drilling, conventional drilling, etc. In FIG. 7, the features 26 are illustrated as openings, of course, any other configurations are considered to be within the scope of various embodiments of the present disclosure. Still further and in the event that the drilling process removes some of the external metallic outer shell 20 and the metallic foam is exposed, a supplemental application process of the external metallic outer shell 20 may be employed to cover the exposed metallic foam. In yet another embodiment, the part 28 may not require any additional features 26 to be added. In one non-limiting embodiment, the component 28 may comprise the formed metallic core 11, an applied external metallic shell 20 and if applicable feature 26 as well as an intermediary layer 22 located between an external surface of the formed metallic core 11 and the applied external metallic shell 20.

Since the external metallic outer shell 20 is applied via a process wherein the localized thickness of the external metallic outer shell 20 may vary with respect to other locations, the thickness of the external metallic outer shell 20 on the exterior of the part may be tailored in thickness, pattern and orientation to provide preferential strength and thus the part or component 28 may have localized structural features such as ribs or gussets, which are provided by the applied external metallic outer shell 20.

Figure 8:
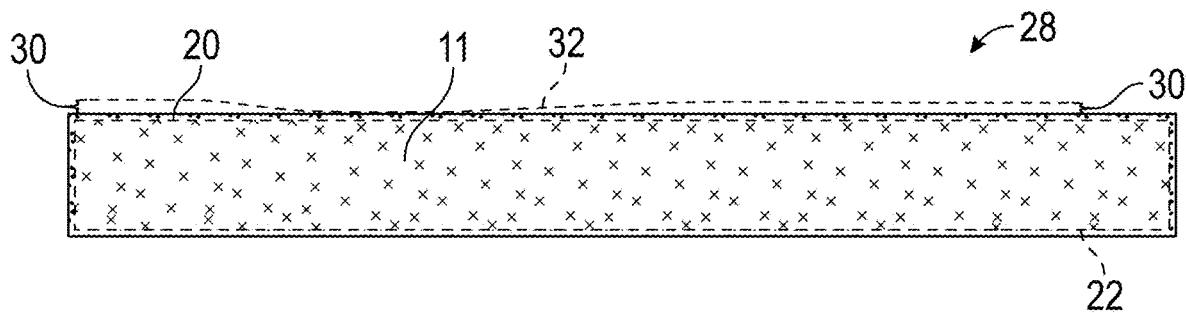
FIG. 8 is a cross-sectional view of a portion of the formed or machined metallic foam of FIG. 6 or 7.
Figure 8A:
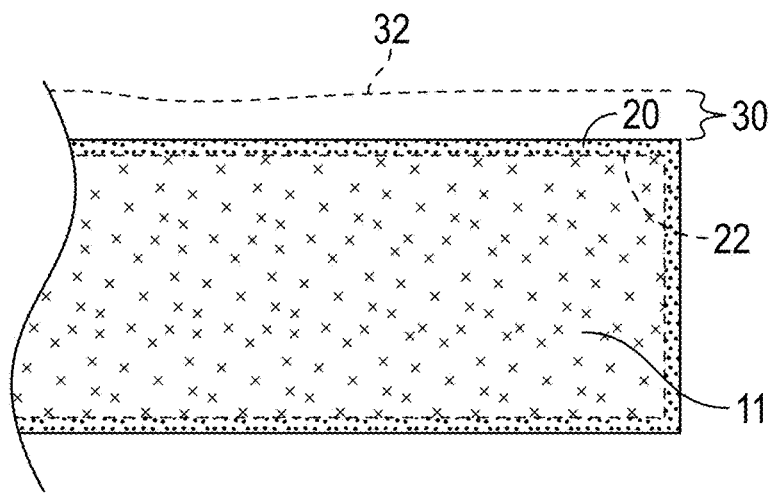
FIG. 8A is an enlarged cross-sectional view of a portion of the formed or machined metallic foam of FIG. 6 or 7.

For example and referring at least to the cross-sectional view of FIGS. 8 and 8A, a thickness 30 of the external metallic outer shell 20 may vary. In FIG. 8, the dashed line 32 is provided to illustrate the varying thickness of the external metallic outer shell 20 that surrounds the internal metallic foam core 11. Also shown in FIGS. 8 and 8A is the intermediary layer 22, which may or may not be applied prior to the application of the external metallic outer shell 20.

In yet another implementation and for parts designed to be capable of bending in certain areas over others, the applied metallic skin on the external surface of the formed part in some applications places the load carrying material away from a neutral axis of the part for high structural efficiency.

In accordance with various embodiments of the present disclosure, machining or forming of the metallic foam core 11 can be done very quickly and at lower expense than machining a solid block of material. This will result in a significant reduction in raw material waste vs. machining processes applied to solid blocks of material. In addition, the metallic deposition on the outside of foam core may be tailored in thickness to provide preferential strength.

Figures 9, 10:
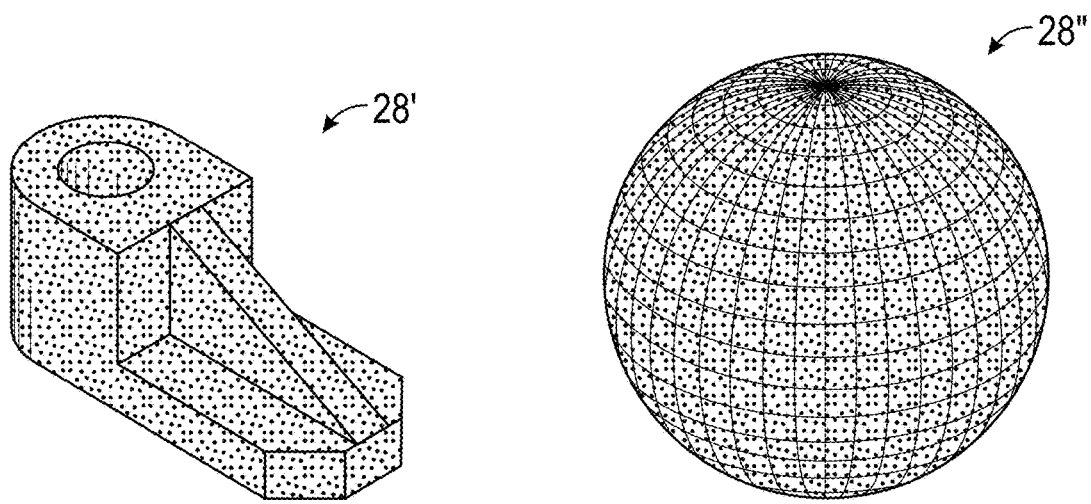
FIGS. 9 and 10 are non-limiting examples of components formed by the methods of the present disclosure.

FIGS. 9 and 10 illustrate non-limiting examples of a part or component 28' and 28" formed by the various methods of the present disclosure. Some additional non-limiting examples of contemplated components or parts include brackets, housings, ducts, liner assemblies, (commercial engine tailcones, nozzles, etc.). In one non-limiting embodiment, the part or component may be an aviation component. In another embodiment, the component may be used in any application where the component weight and cost are key design constraints.

Figure 11:
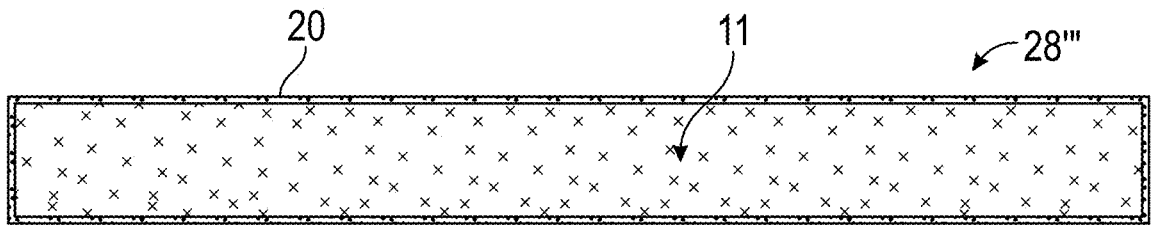
FIGS. 11-13 are cross sectional views of an alternative embodiment of the present disclosure.
Figure 12:
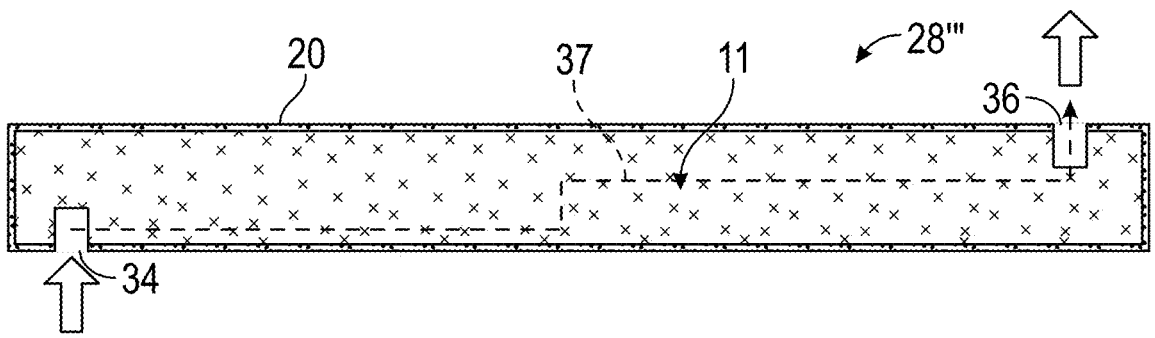
Figure 13:
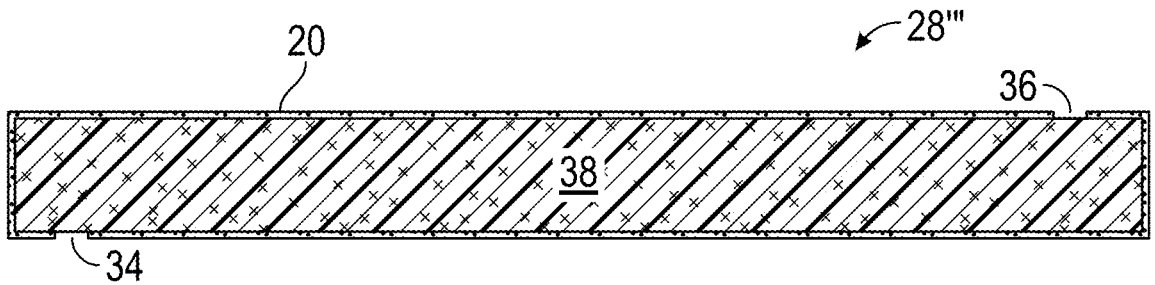

Referring now to FIGS. 11-13, an alternative embodiment of the present disclosure is illustrated. In this embodiment, the formed part or component 28" after application of the external metallic outer shell 20 has an inlet opening 34 formed through the external metallic outer shell 20 and an outlet opening 36 formed through the external metallic outer shell 20 such that a fluid path 37 (illustrated by the dashed lines) is provided through the open cell structure of metallic foam core 11. The inlet opening 34 and the outlet opening 36 may be formed by any of the aforementioned processes such as milling, spot-face drilling, counter-bore drilling, and conventional drilling, etc.

Once the fluid path 37 through the foam core is formed it is used for injection of a secondary material into the metallic foam core 11 in order to alter the physical and/or functional characteristics of the part. For example, in some applications additional strength or rigidity of the formed part or component 28''' is desired versus a formed part or component 28 consisting of the metallic foam core and the external metallic skin. In other examples, vibratory characteristics, thermal or electrical conductivity may be desired in the formed part or component 28'''.

In one embodiment, a thermoplastic or other high temperature fluid flowing non-metallic material including epoxy material 38 is injected into the porous metallic core 11 of the formed part 28'''. The thermoplastic or resin or other flowing material enters through the inlet opening 34 and travels through the core 11 until it begins to exit from the outlet opening 36, which will indicate that the cavity of the core 11 has been filled with the thermoplastic or resin. As illustrated, the inlet opening 34 and the outlet opening 36 are located such that the outlet opening 36 may be used to indicate that the metallic foam core 11 is filled with the thermoplastic or resin. In other words, as the thermoplastic or resin begins to seep out of the outlet opening 36, the metallic foam core 11 has been filled with thermoplastic or resin. Once the cavity of the core 11 is filled with the thermoplastic or resin and as it solidifies it will alter the physical properties of the component. For example, the addition of a thermoplastic or other solidifying material may alter the compressive stress carrying capability of the structure. In other applications, a thermoplastic or other non-metallic material alone may suffice from a structural perspective, but attachment points offering enhanced wear resistance, electrical conductivity, physical appearance or other characteristic may be desired.

Figure 14:
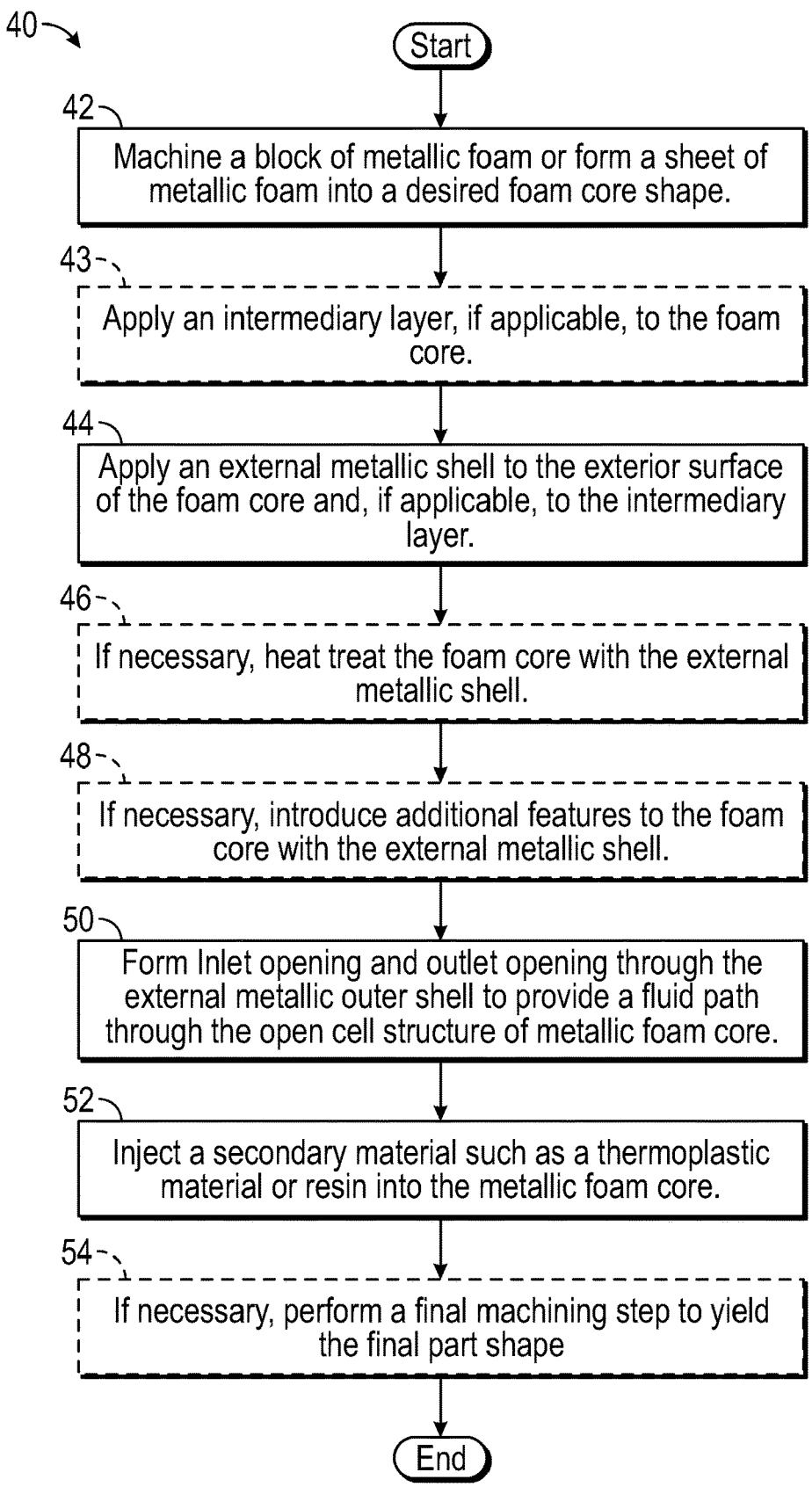
FIG. 14 is a flow chart illustrating a method of making a component according to non-limiting methods of the present disclosure.

Referring now to FIG. 14 a flow chart 40 illustrating a method for forming a part or component 28''' in accordance with various embodiments of the present disclosure is illustrated. At a first step 42, an unformed block of metallic foam 10 is machined to foam core 11. As mentioned above non-limiting machining processes include milling, electrical discharge machining (EDM), water-jet machining, laser machining, combinations thereof or any other process capable of machining the block 10 into the metallic foam core 11 having the component geometry 12. Alternatively and at the first step 42, a sheet of metallic foam 14 may be provided and the sheet of metallic foam 14 is formed into the foam core 11 having the desired part or component geometry 12 via a hot or cold forming process wherein the sheet of metallic foam 14 is placed into a die 16. The die 16 may include a pair of complementary halves 18 configured to form the desired part or component geometry 12. The formed sheet of metallic foam may be further shaped to a final configuration using the aforementioned machining processes.

Thereafter and at step 44, the formed component or metallic core 11 from any of the aforementioned processes (machining, forming or combinations thereof) has an external metallic shell 20 deposited on the exterior surface of the formed metallic foam core 11. As a precursor to step 44, an interim coat or applique may be applied to the foam core 11 prior to the application of the external metallic shell 20. This is illustrated as alternative step 43, which is illustrated in dashed lines. As mentioned above, the external metallic outer shell 20 may be applied via any one of the aforementioned processes including but not limited to: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means.

Once the external metallic outer shell 20 is applied to the exterior surface of the metallic foam pre-form or core 11, this part, may be further subjected to a heat treating step 46, which is illustrated in dashed lines as this step may not be required in all processes.

At step 48, additional features 26, if required, are introduced to the coated metallic foam pre-form or core 11 in order to form the desired part or component 28". These additional features may be added by any suitable process such as milling, spot-face drilling, counter-bore drilling, conventional drilling, etc. Still further and in the event that the drilling process removes some of the external metallic outer shell 20 and the metallic foam is exposed, a supplemental application process of the external metallic outer shell 20 may be employed to cover the exposed metallic foam. In yet another embodiment, the part 28''' may not require any additional features 26 to be added.

At step 50, the aforementioned inlet opening and outlet opening are formed through the external metallic outer shell such that a fluid path is provided through the open cell structure of metallic foam core. Thereafter and at step 52, a secondary material such as thermoplastic material or resin is inserted into the metallic foam core in order to alter the physical and/or functional characteristics of the part. In addition and as illustrated by the dashed lines in FIG. 11, an alternative step 54 may be provided wherein a final machining step of any key attachment, interface or functionally critical surfaces of the part or component occurs after step 52. This would yield the final part shape.

As discussed herein various methods for producing light weight, low-cost components and/or part are provided. Still further components and/or parts formed by the various methods are also provided.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A component, comprising:
a metallic foam core having a desired configuration;
an external metallic shell located on an exterior surface of the desired configuration of the metallic foam core;
an inlet opening and an outlet opening formed in the external metallic shell;
a fluid path extending from the inlet opening through the metallic foam core to the outlet opening; and
a thermoplastic material completely filling the fluid path and extending from the inlet opening to the outlet opening and completely filling the metallic foam core, the thermoplastic material being injected into the metallic foam core through the external metallic shell after the external metallic shell has been applied to the exterior surface of the metallic foam core, wherein the thermoplastic material remains within the metallic foam core after it has solidified.

2. The component as in claim 1, wherein a thickness of the external metallic shell varies in order to provide localized structural rigidity to the component and wherein the metal of the metallic foam core is selected from the group comprising: titanium; cobalt; aluminum, nickel, steel alloys, magnesium, copper, molybdenum, niobium, tungsten, zinc alloys, titanium aluminide, nickel aluminide, and molybdenum disilicide.

3. The component as in claim 1, wherein the metal of the metallic foam core is selected from the group comprising: titanium, cobalt, aluminum, nickel, steel alloys, magnesium, copper, molybdenum, niobium, tungsten, zinc alloys, titanium aluminide, nickel aluminide and molybdenum disilicide.

4. The component as in claim 1, wherein the metallic foam core is an open cell structure.

5. The component as in claim 1, wherein the metallic foam core is formed into the desired configuration by a machining process selected from the group comprising: milling, electrical discharge machining (EDM), water-jet machining, and laser machining, wherein the desired configuration is smaller than final dimensions of the component.

6. The component as in claim 1, wherein the metallic foam core is a sheet of metallic foam and the sheet of metallic foam is formed into the desired configuration by a hot or cold forming process, and wherein the sheet of metallic foam is placed in a die.

7. The component as in claim 6, wherein the metallic foam core is formed into the desired configuration by a machining process selected from the group comprising: milling, grinding, electrical discharge machining (EDM), water-jet machining, and laser machining after the hot or cold forming process.

8. The component as in claim 1, wherein the external metallic shell is deposited on the exterior surface of the metallic foam core via an application process selected from the group comprising: flame spray application process, plasma spray application process, cold-spray application process, electron beam physical vapor deposition (EB/PVD), chemical vapor deposition (CVD), and electroplating application process.

9. The component as in claim 1, wherein an interim coat is deposited on the exterior surface of the metallic foam core prior to the application of the external metallic shell.

10. The component as in claim 9, wherein the interim coat is a ceramic based thermal barrier coating.

11. The component as in claim 1, wherein the metallic foam core is heat treated after the external metallic shell has been applied to the exterior surface of the metallic foam core.

12. The component as in claim 1, wherein additional features are formed in the metallic foam core after the external metallic shell has been applied to the exterior surface of the metallic foam core.

13. The component as in claim 12, wherein the additional features are formed by a drilling process.

14. The component as in claim 1, wherein the inlet opening and the outlet opening are formed by a drilling process.

15. The component as in claim 1, wherein a thickness of the external metallic outer shell varies in order to provide localized structural rigidity to the component.

16. The component as in claim 1, wherein the component is a bracket.

* * * * *